United States Patent [19]
Sakurai

[11] 4,418,399
[45] Nov. 29, 1983

[54] SEMICONDUCTOR MEMORY SYSTEM
[75] Inventor: Junji Sakurai, Tokyo, Japan
[73] Assignee: Fujitsu Limited, Kawasaki, Japan
[21] Appl. No.: 216,674
[22] Filed: Dec. 15, 1980
[30] Foreign Application Priority Data
Dec. 13, 1979 [JP] Japan .............................. 54-162079
[51] Int. Cl.³ .......................... G11C 5/02; G11C 7/00; G11C 11/24
[52] U.S. Cl. ........................................ 365/51; 365/63; 365/182; 365/189; 365/149; 356/230
[58] Field of Search ................... 365/51, 63, 182, 186, 365/189, 230, 231, 149, 72, 205, 208
[56] References Cited
U.S. PATENT DOCUMENTS
3,814,846 6/1974 Snow .................................. 358/213

Primary Examiner—Tommy P. Chin
Attorney, Agent, or Firm—Staas & Halsey

[57] ABSTRACT

A semiconductor memory system providing memory matrix area where many word lines and bit lines cross in the row and column directions. Memory cells are arranged at the intersections resulting in high integration density. A plurality of peripheral circuit blocks connected to adjacent plurality of word lines or bit lines. For example, the sense amplifiers and decoder circuits, etc., are sequentially arranged in files against the direction of the bit lines and word lines, respectively. Thereby, connections between the word lines or bit lines and the peripheral circuit blocks can be made without complicating the structure and using chip area ineffectively.

18 Claims, 5 Drawing Figures

SEMICONDUCTOR MEMORY SYSTEM

BACKGROUND OF THE INVENTION

1. Field of the Invention

The present invention relates to a peripheral circuit block of a semiconductor memory system having a high density memory matrix, and more particularly, to the layout of sense amplifiers connected to bit lines of the high density memory matrix.

2. Description of the Prior Art

Memory cell size can be reduced to about 1 μm × 1 μm, considered to be the limit of current high density memory manufacturing accuracy, particularly in a dynamic RAM (Random Access Memory). But, a large scale integrated memory system with a bit line width of 1 μm and inter-line interval of 1 μm can also be produced. However, the peripheral circuit blocks, such as address decoders connected to the word lines or sense amplifiers connected to the bit lines cannot be accommodated within the minimum size of 1 μm × 1 μm. This is because the peripheral circuit blocks comprise a large number of circuit elements. Currently, a sense amplifier is about 30 μm wide and the bit line width is several microns. Therefore, when a memory matrix is integrated with particularly high density, it is geometrically impossible to arrange the peripheral circuit blocks in a line with the bit lines and word lines. But, when such an attempt is made, the results are that the routing of the bit lines extending from the memory matrix to the sense amplifier requires a large amount of chip area. This area, between the memory matrix and the row of sense amplifiers, is wasted area and used only for routing the bit lines. Moreover, the length of the extension of each bit line differs according to position within the memory matrix. This is particularly a problem in a dynamic RAM, where each memory cell comprises one transistor and one capacitor. Thus, the different capacity between bit lines is very undesirable.

SUMMARY OF THE INVENTION

An object of the invention is to provide highly integrated semiconductor memory system by simplifying the interconnections in the X and Y directions, within the highly integrated memory matrix and the peripheral circuit blocks.

Another object of the invention is to provide a semiconductor memory system overcoming the problems resulting from large differences between the X and Y interconnection densities of the highly integrated memory matrix, and of the peripheral circuit blocks connected to the memory matrix, thus achieving high integration density through effective use of chip area.

Still another object of the invention is to provide a semiconductor memory system achieving high integration density by simplifying the interconnections between the bit lines of the highly integrated memory matrix and the sense amplifiers fabricated with a density different from that of the bit lines.

A further object of the invention is to provide a semiconductor memory system achieving effective use of chip area by simplifying the interconnections between the word lines and/or bit lines of the highly integrated memory matrix and the decoder selecting these lines.

Still a further object of the invention is to provide a highly integrated dynamic random access memory overcoming the difficulties of interconnecting the bit lines of the high density memory matrix comprising memory cells with one transistor and one capacitor and the sense amplifiers connected to the bit lines resulting from the large difference in the sizes of the memory matrix and the sense amplifiers, thus eliminating the wasted chip area required for the interconnections.

The semiconductor memory system of the present invention provides a memory cell matrix having a large number of wirings or wiring-pairs crossing each other in the row and column directions. The memory cells of the matrix are located at these intersections. The matrix is constructed so that the peripheral circuit blocks connected to a predetermined number of adjacent wirings or wiring pairs of the matrix are sequentially arranged in the same direction as the wirings and in such a manner that at least some of said the peripheral circuit blocks are arranged in files, and the wiring from said memory matrix region is connected to the peripheral circuit blocks.

DESCRIPTION OF THE PREFERRED EMBODIMENTS

Recent semiconductor memory system have increased the integration density of the memory cell matrix by reducing the size, by a variety of methods, of the memory cells located at the intersections of the word lines in the row direction and the bit lines in the column direction.

Figure 1:
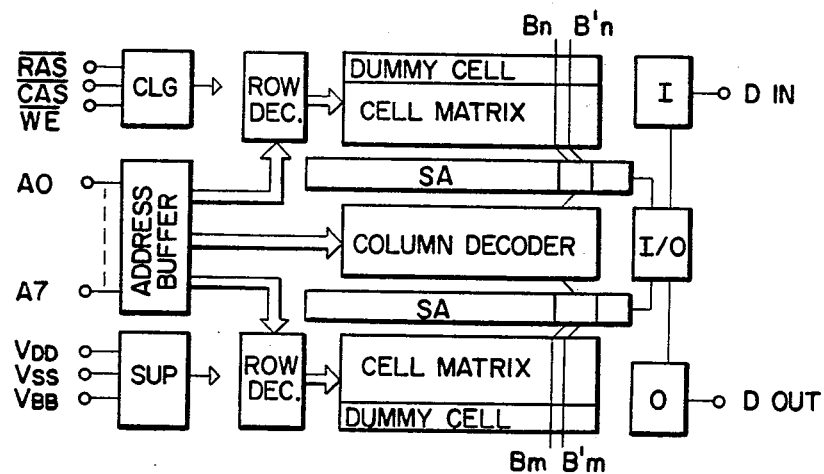
FIG. 1 is a block diagram of the structure of a conventional semiconductor memory system.

FIG. 1 is a block diagram of a conventional semiconductor dynamic RAM system, having memory cells each comprising one transistor and one capacitor. SUP is a power supply circuit which receives a variety of power source voltages $V_{DD}$, $V_{SS}$, $V_{BB}$ from external circuits and supplies them to the internal circuits. CLG is the internal clock generator which receives the row address select signal $\overline{RAS}$, column address select signal $\overline{CAS}$ and write enable signal $\overline{WE}$ from external circuits and supplies predetermined clock signals to the internal circuits. Arranged in the periphery of the memory cell matrix are the sense amplifiers SA, column decoders connected to the bit line pairs Bn, Bn' and Bm, Bm', etc., and the row decoders connected to the word lines in a direction perpendicular to the bit line pairs. To read a memory cell, the memory cell is selected by the column decoder and row decoder in response to the outputs of the address buffer. The address buffer outputs vary in accordance with input the address signals $A_0$, $A_1$,–, $A_7$. The sense amplifier then compares the output of the selected cell connected to bit line Bn and bit line Bn' connected to the dummy cell. The data is then read as output information $D_{out}$ from the output buffer O, via the input-output circuit I/O. Therefore, these are sense amplifiers respectively associated with bit line pairs.

To increase the memory storage capacity, the integration density of the memory cell matrix is improved by reducing the size of the memory cells. This reduction results in varying interconnection lengths between the bit line pairs and sense amplifiers, as indicated in FIG. 1. Also, the sense amplifiers arranged in line cannot be accommodated within the memory cell matrix area as shown in FIG. 1. Therefore, the area required to interconnect the sense amplifiers and bit lines is increased, resulting in ineffective use of and wasted chip area. This ineffective use of chip area is in contrast to the goal of achieving higher integration density.

One way to avoid this ineffective use of chip area is to provide multiplexer switching circuits and use the same sense amplifier for a plurarity of bit line pairs, as described in IEEE Journal of Solid State Circuits Vol. SC-15 No. 2 APRIL 1980, page 184–189. However, the defects of the approach are the extra circuits required, for example, multiplexer switching circuits and timing clock signals for switching above, and the larger memory cells refresh time.

Figure 2:
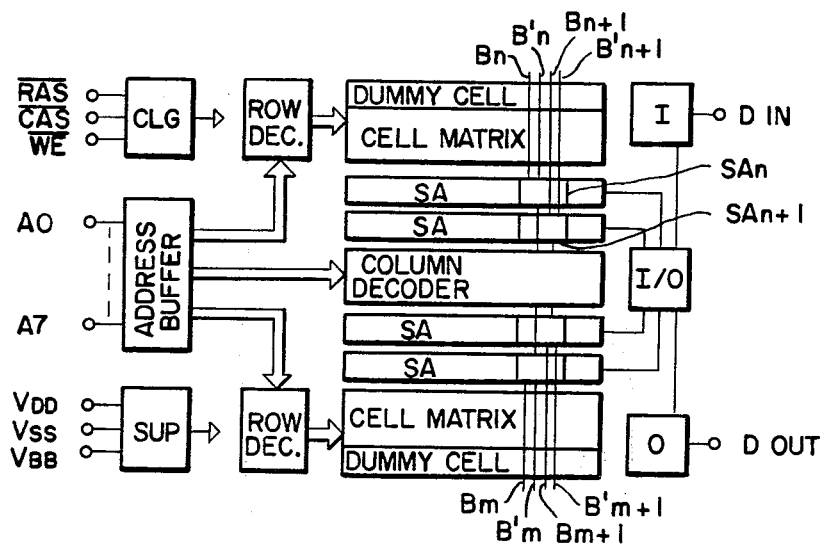
FIG. 2 is a block diagram of the structure of an embodiment of the semiconductor memory system of the present invention.

FIG. 2 is a block diagram of a semiconductor memory system embodying the present invention. The elements in FIG. 2 that are also the same portions shown in FIG. 1 are given the same symbols as in FIG. 1. In the conventional memory system, the sense amplifiers connected to respective bit line pairs are arranged in a line adjacent to the memory matrix. In this embodiment, the sense amplifiers are arranged in two or more lines parallel to the memory matrix. This arrangement prevents the interconnection between the memory matrix and the sense amplifiers from assuming various lengths, and confines the sense amplifiers to the area adjacent to the matrix. In this embodiment, the sense amplifiers SAn, SAn+1 are connected to adjacent two bit line pairs Bn, Bn' and Bn+1, Bn+1' (or Bm, Bm' and Bm+1, Bm+1'), and are arranged in double lines extending at angles to the bit lines. Therefore, the sense amplifiers SAn, SAn+1 can be arranged within the width of the two bit line pairs, thus making it possible to layout the memory matrix with higher integration density and still easily arrange the sense amplifiers even when narrow bit line widths are utilized. Moreover, this arrangement allows the memory matrix to be highly integrated while maintaining simplified interconnections between the sense amplifiers and the bit lines, even when using three or more files of sense amplifiers.

Figure 3:
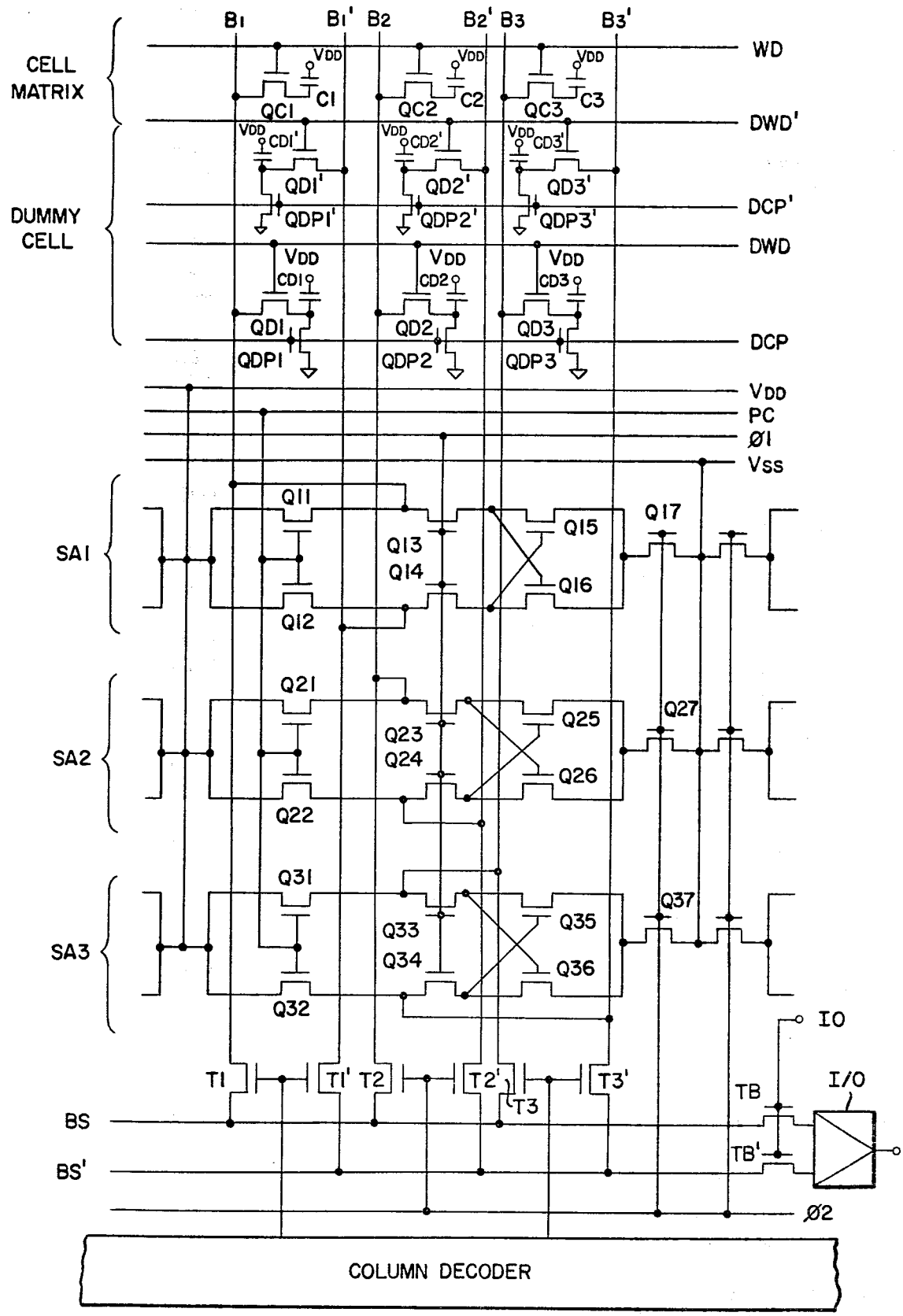
FIG. 3 is a schematic diagram of a part of the semiconductor memory system embodying the present invention.

FIG. 3 is a schematic diagram of a part of FIG. 2. Memory cells are located at the intersections of bit line pairs and word lines; for example, at the intersections of WD and bit line pairs $B_1$, $B_1'$; $B_2$, $B_2'$; $B_3$, $B_3'$. These memory cells respectively comprise transistors $QC_1$, $QC_2$ and $QC_3$, and capacitors $C_1$, $C_2$ and $C_3$. Additionally, at the intersections between the above bit line pairs and the dummy word lines DWD, DWD', dummy cells consisting respectively of transistors $QD_1$, $QD_1'$, $QD_2$, $QD_2'$, $QD_3$, $QD_3'$; capacitors $CD_1$, $CD_1'$, $CD_2$, $CD_2'$, $CD_3$, $CD_3'$; and discharging transistor $QDP_1$, $QDP_1'$, $QDP_2$, $QDP_2'$, $QDP_3$, $QDP_3'$ are provided. DCP, DCP' are signal lines for discharging the dummy cells. The sense amplifiers SA1, SA2, SA3 connected to respective bit line pairs are arranged in three lines extending at angles to the above-mentioned bit line pairs. The arrangement allows the ends of the bit line pairs $B_1$, $B_1'$; $B_2$, $B_2'$ and $B_3$, $B_3'$ to be extended in a straight line in the direction of the bit line to a direction away from the memory cell matrix. The three sense amplifiers SA1, SA2 and SA3 are arranged along the extended bit line and perpendicular to the lines. The width of sense amplifiers in the word line direction is almost equal to the width of the three bit line pairs. In other words, the present embodiment achieves a width of n pairs of bit lines that is almost equal to the width of sense amplifiers. The bit line pairs are divided into blocks of n pairs, and n sense amplifiers are arranged in the bit line direction, as described above, for each block.

The sense amplifiers SA1, SA2 and SA3 respectively comprise transistors $Q_{11}$, $Q_{12}$, $Q_{13}$, $Q_{14}$, $Q_{15}$, $Q_{16}$, $Q_{17}$; $Q_{21}$, $Q_{22}$, $Q_{23}$, $Q_{24}$, $Q_{25}$, $Q_{26}$, $Q_{27}$; and $Q_{31}$, $Q_{32}$, $Q_{34}$, $Q_{35}$, $Q_{36}$, $Q_{37}$ as indicated in FIG. 3. Also connected to the same amplifiers are $V_{DD}$, the high level power supply line; $V_{SS}$, the low level power supply line; PC, the pre-charge signal line; $\emptyset_1$, the interrupt signal line; and $\emptyset_2$, the latch signal line. The bit line pairs are connected to the bus lines BS, BS' via the gate transistors $T_1$, $T_1'$; $T_2$, $T_2'$; and $T_3$, $T_3'$. These transistors are turned ON and OFF in response to control signals from the column decoder. Moreover, the bus lines are also connected to the input-output circuit I/O via the transistor pair TB, TB' which are turned ON and OFF in response to the IO control signal.

The present embodiment employs multilayer wiring, but provides the advantages that all sense amplifiers are arranged adjacent to the memory cell matrix area and no modification of the structure or layout of the other peripheral circuits is required to facilitate extending the bit lines to connect with the sense amplifiers.

Figure 4:
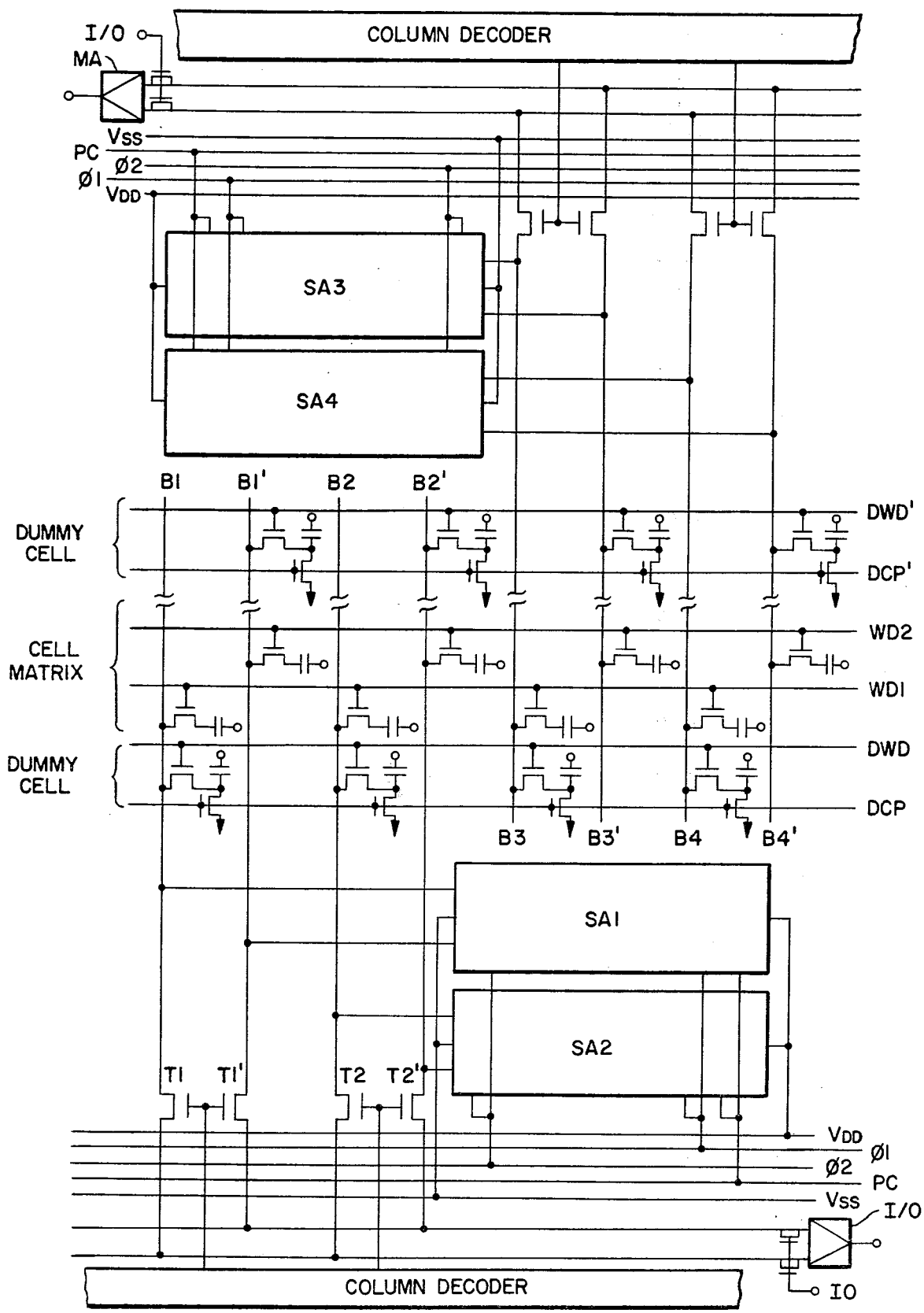
FIG. 4 is a schematic diagram of part of the structure a semiconductor memory system comprising another embodiment of the present invention.

FIG. 4 is a schematic diagram of part of another embodiment of the present invention.

In this embodiment, bit line pairs, for example, $B_1$, $B_1'$ to $B_4$, and $B_4'$ extend to both sides of the memory matrix, with two pairs on each side. Pairs of sense amplifiers are arranged along opposite sides of the memory matrix in the direction of the bit lines; for example, SA1, SA2 on one side and SA3, SA4 on the other side.

In this embodiment, the width of each sense amplifier SA1 to SA4 is equal to the width of two bit line pairs. Therefore the interconnections of the bit lines to the sense amplifiers are placed along the side the sense amplifiers instead of passing above the sense amplifiers as in the previous embodiment. That is, the sense amplifiers SA1, SA2 are formed on the area to which the bit line pairs $B_3$, $B_3'$ and $B_4$, $B_4'$ do not extend, while the sense amplifiers SA3, SA4 are formed on the area to which the bit line pairs $B_1$, $B_1'$ and $B_2$, $B_2'$ do not extend. The extensions of the bit line pairs passing the side of the sense amplifiers SA1 to SA4 are connected to the sense amplifiers SA1 to SA4 without crossing over any sense amplifiers. The number of bit line pairs and number of sense amplifiers, for example, four pairs of bit lines or two pairs of sense amplifiers mentioned above, can be determined in the same way as was explained in reference to FIG. 3. In general, in the embodiment, the width of m m pairs of bit lines of which is almost equal to the width of the sense amplifier is obtained. The bit lines are divided into the blocks of 2m pairs each. For each block, there are 2m sense amplifiers with m sense amplifiers on each side of the memory matrix. The sense amplifiers are arranged in the bit line direction within the width of m bit line pairs. Thus, the arrangement as shown in FIG. 4, can be easily obtained by establishing the required connections.

The previous embodiments adapted the present invention to a memory system of the folded bit line type, where the bit line pairs are provided in parallel to one another.

Figure 5:
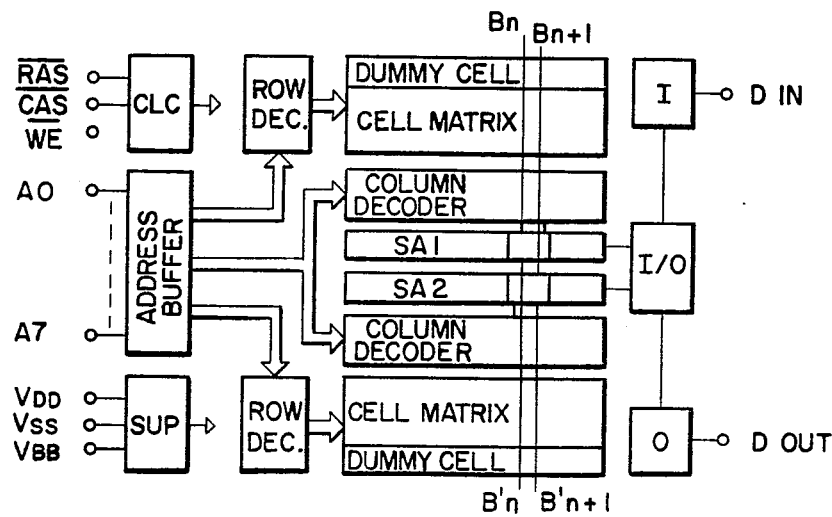
FIG. 5 is a block diagram of the structure of a semiconductor memory system comprising another embodiment of the present invention.

FIG. 5 is a block diagram of an embodiment obtained by adapting the present invention to a memory system where each bit line of bit line pairs, for example, Bn, Bn'; Bn+1', Bn+1', is arranged opposite to, instead of parallel to, the other bit line of the pair. In a dynamic RAM of this type comprising one transistor and one capacitor memory cells, the content of the memory cell connected to the bit line Bn is, for example, read on the basis of a comparison with the content of the dummy memory cell connected to the bit pair line Bn'. A dynamic RAM of this type is larger than the folded bit line type in the interbit line dimension and the width of sense amplifier is much greater than the interbit line width. Therefore, a notable improvement can be obtained by adapting the present invention to this type of dynamic RAM. In the embodiment of FIG. 5, the sense amplifiers SA1 and SA2 are arranged in two lines and the bit line pair Bn, Bn' is connected to the sense amplifier SA1, while the bit line pair Bn+1, Bn+1' is connected to the sense amplifier SA2.

In the above embodiments on, the present invention is explained based on the relationship between the bit lines and sense amplifiers. The same explanation can naturally be adapted to the relationship between the word lines or bit lines and the decoder circuit, and between the word lines or bit lines and the other peripheral circuits connected thereto.

As explained, the present invention has the advantage that the word lines or bit lines of the highly integrated memory matrix can be connected to the peripheral circuit blocks, for example, the address decoder and sense amplifiers, without complicating the structure of the peripheral circuit blocks or using chip area ineffectively.

What is claimed is:

1. A semiconductor memory system comprising:
a memory matrix area having a row direction and a column direction at an angle with said row direction, said matrix area comprising conductors, a first set of said conductors arranged in said row direction and a second set of said conductors arranged in said column direction, each conductor having a plurality of potentials, and said memory matrix area further comprising memory cells arranged at the intersections of said cnductors,
peripheral circuits arranged adjacent to said memory matrix area, and being operatively connected to respective ones of said conductors, a predetermined number of said peripheral circuits being sequentially arranged along a first direction comprising one of the row direction and the column direction such that at least some of said predetermined number of peripheral circuits are substantially arranged in files extending in a direction perpendicular to said first direction.

2. A semiconductor memory system according to claim 1, wherein each of said peripheral circuits has a first dimension approximately equal to the interval between a predetermined number of said conductors,
said respective ones of said conductors extending from said memory matrix area, and each conductor being connected directly to the corresponding peripheral circuit, and passing above at least one of said peripheral circuits.

3. A semiconductor memory system according to claim 1, wherein each of said peripheral circuits has a first dimension approximately equal to the interval between a predetermined number of said conductors, said peripheral circuits being divided into groups comprising a number of peripheral circuits equal to said predetermined number of conductors, said peripheral circuits within each of the groups being arranged on opposite sides of said memory matrix area, such that said peripheral circuits within each of the groups on each side are aligned along different lines parallel to said respective conductors and being shifted in a direction perpendicular to the direction of said respective conductors with respect to said peripheral circuits within the groups on the opposite side by a distance approximately equal to said first dimension, said peripheral circuits within each group being arranged in the direction of said respective ones of said conductors, and wherein
said respective ones of said conductors extending from said memory matrix area are connected to said corresponding peripheral circuits and are arranged along side of said corresponding peripheral circuits.

4. A semiconductor memory system according to claim 1, 2 or 3, wherein said conductors in the column direction extending from said memory matrix area are bit lines, and said peripheral circuits are sense amplifiers which detect potentials of said bit lines.

5. A semiconductor memory system according to claim 1, 2 or 3, wherein said conductors in the row direction extending from said memory matrix area are word lines, and said peripheral circuits are word decoders.

6. A semiconductor memory system according to claim 1, 2, or 3, wherein said conductors extending in the column direction from said memory matrix are bit lines and said peripheral circuits are column decoders for selecting columns.

7. A semiconductor memory system according to claim 1, 2 or 3, wherein each of
said memory cells comprises one transistor and one capacitor connected thereto.

8. A semiconductor memory system according to claim 1, 2 or 3, wherein each of
said memory cells comprises one transistor and one capacitor connected thereto, said conductors extending in the column direction are bit lines, and said peripheral circuits are sense amplifiers which detect potentials of said bit lines.

9. A semiconductor memory system comprising:
a memory cell matrix area having a plurality of rows and a plurality of columns at an angle with said rows, said memory cell matrix area comprising conductors, a first set of said conductors being arranged in the direction of said rows and a second set of said conductors arranged in the direction of said columns, and a plurality of memory cells respectively associated with the intersections of said conductors, wherein each of said plurality of memory cells is operatively connected to respective ones of said intersecting row and column conductors; and
a plurality of peripheral circuits arranged adjacent to said memory cell matrix area, each peripheral circuit having a plurality of inputs operatively connected to corresponding ones of one of said sets of conductors, wherein said plurality of peripheral circuits are aligned in a direction perpendicular to the direction of said corresponding conductors, and wherein at least some of said peripheral circuits are arranged in the direction of said corresponding conductors.

10. A semiconductor memory system according to claim 9, wherein each conductor is spaced a specified distance W from the adjacent conductor, each peripheral circuit has a first dimension measured in a direction perpendicular to said corresponding conductors and being approximately equal to a specified multiple of the distance W, said corresponding ones of said conductors being arranged adjacent to said inputs of said peripheral circuit blocks.

11. A semiconductor memory system according to claim 9, wherein each conductor is spaced a specified distance W from the adjacent conductor;
 each peripheral circuit has a first dimension measured in a direction perpendicular to said corresponding conductors and being approximately equal to a specified multiple of the distance W;
 said peripheral circuits are arranged on oposite sides of said memory cell matrix area so that the peripheral circuits on each side are aligned along different lines, said different lines being parallel to said corresponding conductors and offset by a distance approximately equal to said first dimension, and
 said corresponding ones of said conductors being arranged alongside said peripheral circuits.

12. A semiconductor memory system according to claim 9, 10 or 11, wherein said second set of conductors comprises a plurality of bit lines each having a variable potential and extending in the direction of said columns; and
 wherein said peripheral circuits comprise a plurality of sense amplifiers respectively associated with said plurality of bit lines, each sense amplifier having a plurality of inputs operatively connected to corresponding ones of said plurality of bit lines, and each amplifier having a plurality of outputs varying in response to said varying potential of said bit line associated with said sense amplifier.

13. A semiconductor memory system according to claim 9, 10 or 11, wherein said first set of conductors comprises a plurality of word lines extending in the direction of said rows and having selected and non-selected states; and
 wherein said plurality of peripheral circuits comprises a plurality of word decoder circuits respectively associated with said plurality of word lines, each decoder having a plurality of inputs, and a plurality of outputs operatively connected to corresponding ones of said plurality of word lines, said outputs having selected and non-selected states and varying in response to said selected and non-selected states of said word lines associated with each word decoder.

14. A semiconductor memory system according to claim 9, 10, or 11, wherein said second set of conductors comprises a plurality of bit lines extending in the direction of said columns and having selected and non-selected states; and
 wherein said plurality of peripheral circuits comprises a plurality of column decoders respectively associated with said plurality of bit lines, each column decoder having a plurality of inputs, and a plurality of outputs operatively connected to corresponding ones of said plurality of bit lines, said outputs having selected and non-selected states and varying in response to said selected and non-selected states of said bit lines associated with each of said column decoders.

15. A semiconductor memory system according to claim 9, 10 or 11, wherein said first set of conductors and said second set of conductors comprise word lines and bit lines respectively, and wherein said memory cell comprises:
 a capacitor having a first terminal operatively connected to a relatively high supply voltage, and a second terminal; and
 a transistor having a source operatively connected to said second terminal of said capacitor, a drain operatively connected to a bit line and a gate operatively connected to a word line.

16. A semiconductor memory system according to claim 15, wherein each of said bit lines has a variable potential, said plurality of peripheral circuits comprises a plurality of sense amplifiers respectively associated with said plurality of bit lines, each amplifier having a plurality of inputs operatively connected to said associated bit lines, and a plurality of outputs varying in response to said varying potential of said bit lines, and each of said plurality of sense amplifiers detecting the varying potential of said bit lines associated with said sense amplifier.

17. A semiconductor memory system according to claim 9, 10 or 11, further comprising a precharge signal line, an interrupt signal line, and a latch signal line, and wherein said plurality of peripheral circuits comprises a plurality of sense amplifiers and said second set of conductors comprises a plurality of bit lines, and
 wherein each sense amplifier comprises:
 first and second transistors wherein the drain of said first transistor is operatively connected to the drain of said second transistor and to a relatively high supply voltage, the gate of said first transistor is operatively connected to the gate of said second transistor and to said pre-charge signal line, the source of said first transistor and the source of said second transistor are operatively connected to corresponding ones of said plurality of bit lines;
 third and fourth transistors wherein the drains of said third and fourth transistors are respectively, operatively connected to the sources of said first and second transistors, and the drain of said third transistor operatively connected to the drain of said fourth transistor and to said interrupt signal line;
 fifth and sixth transistors wherein the gate of said fifth transistor is operatively connected to the drain of said sixth transistor and to the source of said third transistor, and the gate of said sixth transistor is operatively connected to the drain of said fifth transistor and to the source of said third transistor; and
 a seventh transistor wherein the drain of said seventh transistor is operatively connected to the source of said fifth transistor and to the source of said sixth transistor, the gate of said seventh transistor is operatively connected to said latch signal line, and the source of said seventh transistor is operatively connected to said relatively lower supply voltage.

18. A semiconductor memory system according to claim 9, 10 or 11, wherein said conductors comprise a plurality of word lines, a plurality of bit lines at an angle with said word lines, a plurality of dummy cell word lines extending in a direction parallel to said word lines and intersecting said plurality of bit lines, and a plurality of dummy cell discharge lines extending in a direction parallel to said word lines and intersecting said plurality of bit lines, and wherein said memory cell matrix area further comprises:
- a plurality of dummy cells respectively associated with said intersections of said dummy cell word lines and said bit lines, each dummy cell comprising:
- a first transistor comprising a source, a drain, and a gate, wherein the drain and gate of said first transistor are operatively connected to a corresponding one of said plurality of bit lines and a corresponding one of said plurality of dummy cell word lines respectively;
- a second transistor comprising a source, a drain and a gate, wherein the gate of said second transistor is operatively connected to a corresponding one of said plurality of said dummy cell discharge lines, the source of said second transistor operatively connected to a supply voltage ground; and
- a capacitor having a first terminal operatively connected to a relatively high supply voltage and a second terminal operatively connected to said source of said first transistor and to said drain of said second transistor.

* * * * *

UNITED STATES PATENT AND TRADEMARK OFFICE
CERTIFICATE OF CORRECTION

PATENT NO. : 4,418,399

DATED : November 29, 1983

INVENTOR(S) : SAKURAI

It is certified that error appears in the above-identified patent and that said Letters Patent is hereby corrected as shown below:

```
Column 2, line 15, delete "said";
          line 16, "said" should be --the--;
          line 30, after "structure" insert --of--;
          line 64, delete "input";
          line 64, after "address" insert --input--.
Column 3, line 39, delete "at";
          line 40, "angles" should be --in the direction
perpendicular--;
          line 65, "at angles" should be -- in the direction
perpendicular--;
          line 67, after "B_2" insert --;--.
Column 4, line 15, "same" should be --sense--;
          line 28, after "area" insert --,--;
          line 43, after "side" insert --of--;
          line 58, after "m" (first occurrence) insert --of--;
          line 58, delete "of" (third occurrence).
Column 5, line 6, "+1'" should be --+1--;(first occurrence).
          line 9, "cells" should be --cell--;
          line 9, "cell" should be --cells--;
```

UNITED STATES PATENT AND TRADEMARK OFFICE
CERTIFICATE OF CORRECTION

PATENT NO. : 4,418,399  Page 2 of 2

DATED : November 29, 1983

INVENTOR(S) : SAKURAI

It is certified that error appears in the above-identified patent and that said Letters Patent is hereby corrected as shown below:

line 23, delete "on";
line 47, "cnductors" should be --conductors--.

Signed and Sealed this

Twenty-sixth Day of June 1984

[SEAL]

Attest:

GERALD J. MOSSINGHOFF

Attesting Officer   Commissioner of Patents and Trademarks

UNITED STATES PATENT AND TRADEMARK OFFICE
CERTIFICATE OF CORRECTION

PATENT NO. : 4,418,399
DATED : November 29, 1983
INVENTOR(S) : SAKURAI

It is certified that error appears in the above-identified patent and that said Letters Patent is hereby corrected as shown below:

```
Column 2, line 15, delete "said";
          line 16, "said" should be --the--;
          line 30, after "structure" insert --of--;
          line 64, delete "input";
          line 64, after "address" insert --input--.
Column 3, line 39, delete "at";
          line 40, "angles" should be --in the direction
perpendicular--;
          line 65, "at angles" should be -- in the direction
perpendicular--;
          line 67, after "B_2" insert --;--.
Column 4, line 15, "same" should be --sense--;
          line 28, after "area" insert --,--;
          line 43, after "side" insert --of--;
          line 58, after "m" (first occurrence) insert --of--;
          line 58, delete "of" (second occurrence).
Column 5, line 6, "+1'" should be --+1--;
          line 9, "cells" should be --cell--;
          line 9, "cell" should be --cells--;
```

UNITED STATES PATENT AND TRADEMARK OFFICE
CERTIFICATE OF CORRECTION

PATENT NO. : 4,418,399  Page 2 of 2
DATED : November 29, 1983
INVENTOR(S) : Sakurai It is certified that error appears in the above-identified patent and that said Letters Patent is hereby corrected as shown below:

Column 5, line 23, delete "on";
       line 47, "cnductors" should be --conductors--.

This certificate supersedes certificate of correction issued June 26, 1984.

Signed and Sealed this

Fifth Day of November 1985

[SEAL]

Attest:

DONALD J. QUIGG

Attesting Officer     Commissioner of Patents and Trademarks